US011982016B2

(12) United States Patent
Goto et al.

(10) Patent No.: US 11,982,016 B2
(45) Date of Patent: May 14, 2024

(54) METHOD FOR GROWING BETA-$Ga_2O_3$-BASED SINGLE CRYSTAL FILM, AND CRYSTALLINE LAYERED STRUCTURE

(71) Applicants: TAMURA CORPORATION, Tokyo (JP); NATIONAL UNIVERSITY CORPORATION TOKYO UNIVERSITY OF AGRICULTURE AND TECHNOLOGY, Tokyo (JP)

(72) Inventors: Ken Goto, Tokyo (JP); Kohei Sasaki, Tokyo (JP); Akinori Koukitu, Tokyo (JP); Yoshinao Kumagai, Tokyo (JP); Hisashi Murakami, Tokyo (JP)

(73) Assignees: Tamura Corporation, Tokyo (JP); National University Corporation Tokyo University of Agriculture and Technology, Tokyo (JP)

(*) Notice: Subject to any disclaimer, the term of this patent is extended or adjusted under 35 U.S.C. 154(b) by 0 days.

(21) Appl. No.: 17/471,395

(22) Filed: Sep. 10, 2021

(65) Prior Publication Data
US 2021/0404086 A1 Dec. 30, 2021

Related U.S. Application Data

(63) Continuation of application No. 15/025,956, filed as application No. PCT/JP2014/074659 on Sep. 18, 2014, now abandoned.

(30) Foreign Application Priority Data

Sep. 30, 2013 (JP) ............................... 2013-203198
Apr. 22, 2014 (JP) ............................... 2014-088589

(51) Int. Cl.
*C30B 25/16* (2006.01)
*C23C 16/40* (2006.01)
*C23C 16/448* (2006.01)
*C30B 25/02* (2006.01)
*C30B 29/16* (2006.01)
*H01L 21/02* (2006.01)
*H01L 29/04* (2006.01)
*H01L 29/24* (2006.01)

(52) U.S. Cl.
CPC ............ *C30B 25/165* (2013.01); *C23C 16/40* (2013.01); *C23C 16/4488* (2013.01); *C30B 25/02* (2013.01); *C30B 29/16* (2013.01); *H01L 21/02414* (2013.01); *H01L 21/02433* (2013.01); *H01L 21/02565* (2013.01); *H01L 21/02576* (2013.01); *H01L 21/02259* (2013.01); *H01L 21/02598* (2013.01); *H01L 21/02262* (2013.01); *H01L 21/02634* (2013.01); *H01L 29/04* (2013.01); *H01L 29/24* (2013.01)

(58) Field of Classification Search
CPC .................................................... C30B 25/165
See application file for complete search history.

(56) References Cited

U.S. PATENT DOCUMENTS

| | | | |
|---|---|---|---|
| 4,144,116 A * | 3/1979 | Jacob | ...................... C30B 25/02 |
| | | | 438/509 |
| 7,176,115 B2 | 2/2007 | Kitaoka et al. | |
| 7,951,685 B2 | 5/2011 | Sazawa et al. | |
| 9,245,749 B2 | 1/2016 | Sasaki et al. | |
| 9,281,180 B2 | 3/2016 | Koukitu et al. | |
| 9,461,124 B2 | 10/2016 | Sasaki et al. | |
| 10,676,841 B2 * | 6/2020 | Goto | ................. H01L 21/02634 |
| 2004/0183090 A1 | 9/2004 | Kitaoka et al. | |
| 2005/0263065 A1 | 12/2005 | Negley | |
| 2006/0150891 A1 | 7/2006 | Ichinose et al. | |
| 2007/0166967 A1 * | 7/2007 | Ichinose | ................. C30B 13/00 |
| | | | 438/510 |
| 2008/0265264 A1 | 10/2008 | Ichinose et al. | |
| 2009/0243043 A1 | 10/2009 | Wang | |
| 2010/0084742 A1 | 4/2010 | Sazawa et al. | |
| 2010/0229789 A1 | 9/2010 | Ichinose et al. | |
| 2012/0304918 A1 | 12/2012 | Ichinose et al. | |
| 2013/0130477 A1 | 5/2013 | Koukuti et al. | |
| 2014/0217405 A1 | 8/2014 | Sasaki et al. | |
| 2014/0217469 A1 | 8/2014 | Sasaki et al. | |

(Continued)

FOREIGN PATENT DOCUMENTS

CN 101517715 A 8/2009
EP 2 570 523 A1 3/2013

(Continued)

OTHER PUBLICATIONS

Fujito et al, Journal of Crystal Growth, 311, 2009, 3011-3014 (Year: 2009).*
Koukitu et al , J. Appl. Phys, 37, 1998, 762-765 (Year: 1998).*
Binions R. et al., "A Comparison of the Gas Sensing Properties of Solid State Metal Oxide Semiconductor Gas Sensors Produced by Atmospheric Pressure Chemical Vapour Deposition and Screen Printing", Measurement Science and Technology 18(1):190-200 (2007).
Bohnen T. et al., "Enhanced Growth Rates and Reduced Parasitic Deposition by the Substitution of Cl2 for HCl in GaN HVPE", Journal of Crystal Growth 312:2542-2550 (2010).
Nomura K. et al., "Thermodynamic Study of β—Ga2O3 Growth by Halide Vapor Phase Epitaxy", Journal of Crystal Growth 405:19-22 (2014).

(Continued)

*Primary Examiner* — Irina Krylova
(74) *Attorney, Agent, or Firm* — Scully, Scott, Murphy & Presser, PC

(57) ABSTRACT

As one embodiment, the present invention provides a method for growing a β-$Ga_2O_3$-based single crystal film by using HYPE method. The method includes a step of exposing a $Ga_2O_3$-based substrate to a gallium chloride-based gas and an oxygen-including gas, and growing a β-$Ga_2O_3$-based single crystal film on a principal surface of the $Ga_2O_3$-based substrate at a growth temperature of not lower than 900° C.

5 Claims, 12 Drawing Sheets

(56) References Cited

U.S. PATENT DOCUMENTS

2014/0331919 A1  11/2014  Sasaki
2016/0265137 A1   9/2016  Goto et al.
2017/0145590 A1   5/2017  Goto et al.

FOREIGN PATENT DOCUMENTS

| JP | 2005012171 A | 1/2005 |
|---|---|---|
| JP | 2010-030896 A | 2/2010 |
| JP | 4565062 B2 | 10/2010 |
| JP | 2013-056803 A | 3/2013 |
| WO | 2011/142402 A1 | 11/2011 |
| WO | 2013/035842 A1 | 3/2013 |
| WO | 2013/035845 A1 | 3/2013 |
| WO | 2013/080972 A1 | 6/2013 |

OTHER PUBLICATIONS

Mori E. et al., "Vapor-Phase Epitaxial Growth of GA2O3", Faculty of Engineering The University of Tokyo Engineering Research Institute Annual, vol. 35, pp. 155-161 (1976), together with an English-language abstract.

Verified translation of Mori E. et al., "Vapor-Phase Epitaxial Growth of GA2O3", pp. 1-26 (Jun. 1976).

Oshima T. et al., "Surface Morphology of Homoepitaxial B—Ga2O3 Thin Films Grown by Molecular Beam Epitaxy", Thin Solid Films 516:5768-5771 (Jul. 1, 2008).

Villora E.G. et al., "Electrical Conductivity and Carrier Concentration Control in B—Ga2O3 by Si Doping", Applied Physics Letters 92:202120 (2008).

Extended Supplementary European Search Report dated May 22, 2017 received in European Application No. 14 84 9461.0.

International Search Report dated Dec. 16, 2014 received in International Application No. PCT/JP2014/074659, together with an English-language translation.

English-language Translation of the International Preliminary Report on Patentability dated Mar. 31, 2016 received in International Application No. PCT/JP2014/074659.

Japanese Office Action dated Jul. 3, 2018 received in Japanese Patent Application No. 2016-143092, together with an English-language translation.

Japanese Office Action dated Jan. 15, 2016 issued in JP 2014-088589, together with partial English-language translation.

Official Action dated Jul. 7, 2023 received from the China National Intellectual Property Administration in related application CN 202111128251.4 together with English language translation.

Official Action dated Jan. 23, 2024 received from the China National Intellectual Property Administration in related application CN 202111128251.4 together with English language translation.

* cited by examiner

METHOD FOR GROWING BETA-Ga₂O₃-BASED SINGLE CRYSTAL FILM, AND CRYSTALLINE LAYERED STRUCTURE

CROSS REFERENCE TO RELATED APPLICATIONS

The present application is a continuation application of U.S. patent application Ser. No. 15/025,956, filed Mar. 30, 2016, which claims priority as a national stage filing under 35 U.S.C. 371 of PCT/JP2014/074659, filed Sep. 18, 2014, the entire contents of each of which are incorporated herein by reference.

TECHNICAL FIELD

The invention relates to a method for growing a $\beta$-Ga$_2$O$_3$-based single crystal film and a crystalline layered structure.

BACKGROUND ART

The MBE (Molecular Beam Epitaxy) method and the PLD (Pulsed Laser Deposition) method are known as a growth method of $\beta$-Ga$_2$O$_3$ single crystal film (see, e.g., PTL 1 and PTL 2). Other growth methods thereof, the sol-gel process, the MOCVD (Metal Organic Chemical Vapor Deposition) process and the mist CVD process are also known.

CITATION LIST

Patent Literature

[PTL 1]
  JP-A-2013-56803
[PTL 2]
  JP-B-4565062

SUMMARY OF INVENTION

Technical Problem

The MBE method is conducted, however, such that crystal is grown in a high vacuum chamber. Thus, it is difficult to increase the diameter of a $\beta$-Ga$_2$O$_3$ single crystal film. Although a high-quality film can be generally obtained by increasing the growth temperature, a sufficient film growth rate is not obtained due to an increase in re-evaporation of source gases and it is thus not suitable for mass production.

The PLD method is not suitable for growing a film with a large area since a source (a raw material supply source to a substrate) is a point source which causes a growth rate to be different between a portion immediately above the source and other portions and in-plane distribution of film thickness is likely to be non-uniform. In addition, it takes long time to form a thick film due to a low film growth rate, hence, not suitable for mass production.

In regard to the sol-gel method, the MOCVD method and the mist CVD method, it is relatively easy to increase a diameter but it is difficult to obtain single crystal films with high purity since impurities contained in the used materials are incorporated into the $\beta$-Ga$_2$O$_3$ single crystal film during epitaxial growth.

Thus, it is an object of the invention to provide a method for growing a $\beta$-Ga$_2$O$_3$-based single crystal film that allows a high-quality and large-diameter $\beta$-Ga$_2$O$_3$-based single crystal film to grow efficiently, as well as a crystalline layered structure having the $\beta$-Ga$_2$O$_3$-based single crystal film grown by the method.

Solution to Problem

According to an embodiment of the invention, in order to achieve the object, a growth method of a $\beta$-Ga$_2$O$_3$-based single crystal film defined by [1] to [8] below will be provided.

[1] A method for growing a $\beta$-Ga$_2$O$_3$-based single crystal film by HVPE method, comprising a step of exposing a Ga$_2$O$_3$-based substrate to a gallium chloride-based gas and an oxygen-including gas and growing a $\beta$-Ga$_2$O$_3$-based single crystal film on a principal surface of the Ga$_2$O$_3$-based substrate at a growth temperature of not lower than 900° C.

[2] The method for growing a $\beta$-Ga$_2$O$_3$-based single crystal film defined by [1], wherein the gallium chloride-based gas is produced by reacting a gallium source with a Cl-including gas comprising a Cl$_2$ gas or an HCl gas.

[3] The method for growing a $\beta$-Ga$_2$O$_3$-based single crystal film defined by [1] or [2], wherein in the gallium chloride-based gas a GaCl gas has a highest partial pressure ratio.

[4] The method for growing a $\beta$-Ga$_2$O$_3$-based single crystal film defined by [1] or [2], wherein the oxygen-including gas comprises an O$_2$ gas.

[5] The method for growing a $\beta$-Ga$_2$O$_3$-based single crystal film defined by [2], wherein the Cl-including gas comprises a Cl$_2$ gas.

The method for growing a $\beta$-Ga$_2$O$_3$-based single crystal film defined by [1] or [2], wherein a ratio of a supplied partial pressure of the oxygen-including gas to a supplied partial pressure of the gallium chloride-based gas when growing the $\beta$-Ga$_2$O$_3$-based single crystal film is not more less than 0.5.

[7] The method for growing a $\beta$-Ga$_2$O$_3$-based single crystal film defined by [1] or [2], wherein the principal surface of the Ga$_2$O$_3$-based substrate has a plane orientation of (010), (−201), (001) or (101).

[8] The method for growing a $\beta$-Ga$_2$O$_3$-based single crystal film defined by [1] or [2], wherein the gallium chloride-based gas is produced at an atmosphere temperature of not less than 300° C.

According to another embodiment of the invention, in order to achieve the object, a crystalline layered structure defined by [9] to [12] below will be provided.

[9] A crystalline layered structure, comprising:
  a Ga$_2$O$_3$-based substrate; and
  a $\beta$-Ga$_2$O$_3$-based single crystal film that is formed on a principal surface of the Ga$_2$O$_3$-based substrate by epitaxial crystal growth and includes Cl.

[10] The crystalline layered structure defined by [9], wherein a Cl concentration in the $\beta$-Ga$_2$O$_3$-based single crystal film is not more than $5 \times 10^{16}$ atoms/cm$^3$.

[11] The crystalline layered structure defined by [9] or [10], wherein the $\beta$-Ga$_2$O$_3$-based single crystal film comprises a $\beta$-Ga$_2$O$_3$ crystal film.

[12] The crystalline layered structure defined by [11], wherein a residual carrier concentration in the $\beta$-Ga$_2$O$_3$-based single crystal film is not more than $3 \times 10^{15}$ atoms/cm$^3$.

Advantageous Effects of Invention

According to the invention, a method for growing a $\beta$-Ga$_2$O$_3$-based single crystal film can be provided that allows a high-quality and large-diameter $\beta$-Ga$_2$O$_3$-based

DESCRIPTION OF EMBODIMENT

Embodiment (Configuration of Crystalline Layered Structure)

Figure 1:
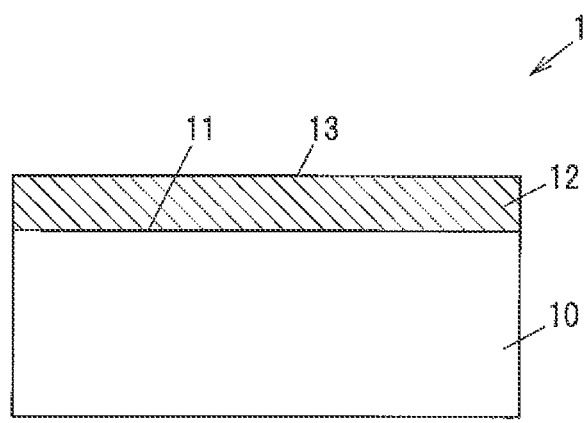
FIG. 1 is a vertical cross-sectional view showing a crystalline layered structure in an embodiment.

FIG. 1 is a vertical cross-sectional view showing a crystalline layered structure 1 in an embodiment. The crystalline layered structure 1 has a $Ga_2O_3$-based substrate 10 and a $\beta$-$Ga_2O_3$-based single crystal film 12 formed on a principal surface 11 of the $Ga_2O_3$-based substrate 10 by epitaxial crystal growth.

The $Ga_2O_3$-based substrate 10 is a substrate formed of a $Ga_2O_3$-based single crystal with a $\beta$-crystal structure. The $Ga_2O_3$-based single crystal here means a $Ga_2O_3$ single crystal or is a $Ga_2O_3$ single crystal doped with an element such as Al or In, and may be, e.g., a $(Ga_xAl_yIn_{(1-x-y)})_2O_3$ (0<x≤1, 0≤y≤1, 0<x+y≤1) single crystal which is a $Ga_2O_3$ single crystal doped with Al and In. The band gap is widened by adding Al and is narrowed by adding In. In addition, the $Ga_2O_3$-based substrate 10 may contain a conductive impurity such as Si.

The plane orientation of the principal surface 11 of the $Ga_2O_3$-based substrate 10 is, e.g., (010), (−201), (001) or (101).

To form the $Ga_2O_3$-based substrate 10, for example, a bulk crystal of a $Ga_2O_3$-based single crystal grown by, e.g., a melt-growth technique such as the FZ (Floating Zone) method or the EFG (Edge Defined Film Fed Growth) method is sliced and the surface thereof is then polished.

The $\beta$-$Ga_2O_3$-based single crystal film 12 is formed of a $Ga_2O_3$-based single crystal with a $\beta$-crystal structure in the same manner as the $Ga_2O_3$-based substrate 10. In addition, the $\beta$-$Ga_2O_3$-based single crystal film 12 may contain a conductive impurity such as Si.

(Structure of Vapor Phase Deposition System)

A structure of a vapor phase deposition system used for growing the $\beta$-$Ga_2O_3$-based single crystal film 12 in the present embodiment will be described below as an example.

Figure 2:
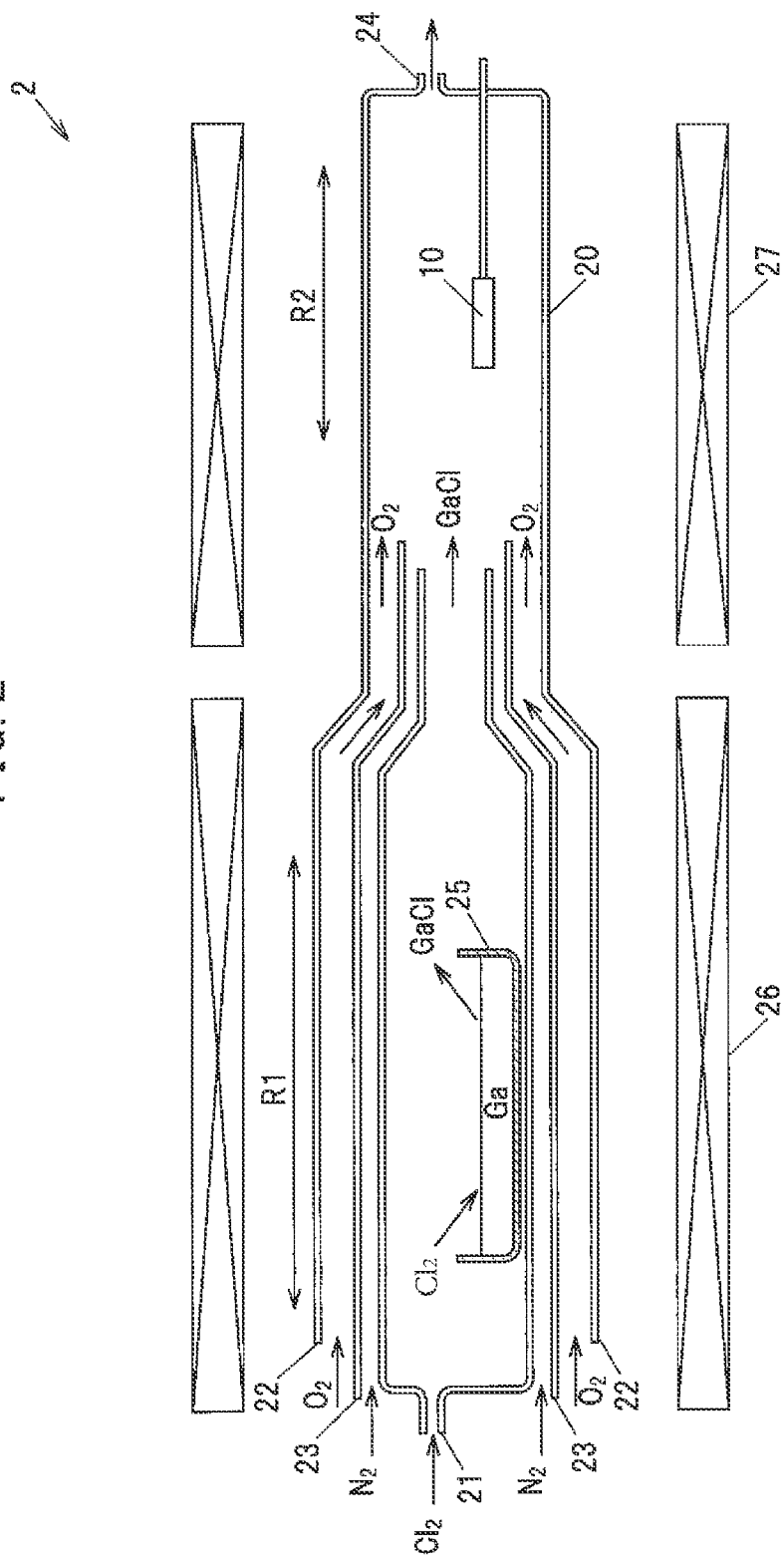
FIG. 2 is a vertical cross-sectional view showing a vapor phase deposition system in the embodiment.

FIG. 2 is a vertical cross-sectional view showing a vapor phase deposition system 2 in the embodiment. The vapor phase deposition system 2 is a vapor phase deposition system using HYPE (Halide Vapor Phase Epitaxy) technique, and has a reaction chamber 20 having a first gas introducing port 21, a second gas introducing port 22, a third gas introducing port 23 and an exhaust port 24, and a first heating means 26 and a second heating means 27 which are placed around the reaction chamber 20 to heat predetermined regions in the reaction chamber 20.

The growth rate when using the HYPE technique is higher than that in the PLD method, etc. In addition, in-plane distribution of film thickness is highly uniform and it is possible to grow a large-diameter film. Therefore, it is suitable for mass production of crystal.

The reaction chamber 20 has a source reaction region R1 in which a reaction container 25 containing a Ga source is placed and a gallium source gas is produced, and a crystal growth region R2 in which the $Ga_2O_3$-based substrate 10 is placed and the $\beta$-$Ga_2O_3$-based single crystal film 12 is grown thereon. The reaction chamber 20 is formed of, e.g., quartz glass.

Here, the reaction container 25 is formed of, e.g., quartz glass and the Ga source contained in the reaction container 25 is metal gallium.

The first heating means 26 and the second heating means 27 are capable of respectively heating the source reaction region R1 and the crystal growth region R2 of the reaction chamber 20. The first heating means 26 and the second heating means 27 are, e.g., resistive heaters or radiation heaters.

The first gas introducing port 21 is a port for introducing a Cl-containing gas ($Cl_2$ gas or HCl gas) into the source reaction region R1 of the reaction chamber 20 using an inert carrier gas ($N_2$ gas, Ar gas or He gas). The second gas introducing port 22 is a port for introducing an oxygen-containing gas ($O_2$ gas or $H_2O$ gas, etc.) as an oxygen source gas and a chloride gas (e.g., silicon tetrachloride, etc.) used to add a dopant such as Si to the $\beta$-$Ga_2O_3$-based single crystal film 12, into the crystal growth region R2 of the reaction chamber 20 using an inert carrier gas ($N_2$ gas, Ar gas or He gas). The third gas introducing port 23 is a port for introducing an inert carrier gas ($N_2$ gas, Ar gas or He gas) into the crystal growth region R2 of the reaction chamber 20.

(Growth of $\beta$-$Ga_2O_3$-Based Single Crystal Film)

A process of growing the $\beta$-$Ga_2O_3$-based single crystal film 12 in the present embodiment will be described below as an example.

Firstly, the source reaction region R1 of the reaction chamber 20 is heated by the first heating means 26 and an atmosphere temperature in the source reaction region R1 is then maintained at a predetermined temperature.

Next, in the source reaction region R1, a Cl-containing gas introduced through the first gas introducing port 21 using a carrier gas is reacted with the metal gallium in the reaction container 25 at the above-mentioned atmosphere temperature, thereby producing a gallium chloride gas.

The atmosphere temperature in the source reaction region R1 here is preferably a temperature at which GaCl gas has the highest partial pressure among component gases of the gallium chloride gas produced by the reaction of the metal gallium in the reaction container 25 with the Cl-containing gas. The gallium chloride gas here contains GaCl gas, $GaCl_2$ gas, $GaCl_3$ gas and $(GaCl_3)_2$ gas, etc.

The temperature at which a driving force for growth of $Ga_2O_3$ crystal is maintained is the highest with the GaCl gas among the gases contained in the gallium chloride gas. Growth at a high temperature is effective to obtain a high-quality $Ga_2O_3$ crystal with high purity. Therefore, for growing the $\beta$-$Ga_2O_3$-based single crystal film 12, it is preferable to produce a gallium chloride gas in which a partial pressure of GaCl gas having a high driving force for growth at a high temperature is high.

Figure 3:
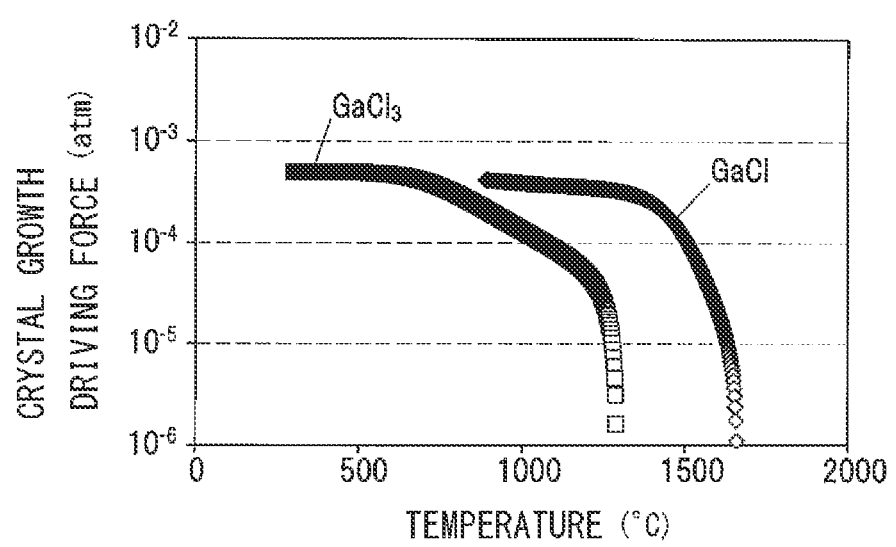
FIG. 3 is a graph showing a relation, based on calculation of thermal equilibrium, between a driving force for growth and a growth temperature of $Ga_2O_3$ crystal in the case that a gallium chloride gas is only of a GaCl gas and a $GaCl_3$ gas, respectively.

FIG. 3 is a graph showing a relation, based on calculation of thermal equilibrium, between a driving force for growth and a growth temperature of $Ga_2O_3$ crystal respectively when a gallium chloride gas consists of only a GaCl gas and consists of only a $GaCl_3$ gas. The calculation conditions are as follows: a carrier gas is, e.g., an inert gas such as $N_2$, a furnace pressure is 1 atm, the supplied partial pressures of GaCl gas and $GaCl_3$ gas are both $1\times10^{-3}$ atm, and an $O_2$/GaCl partial pressure ratio is 10.

In FIG. 3, the horizontal axis indicates a growth temperature (° C.) of $Ga_2O_3$ crystal and the vertical axis indicates a driving force for crystal growth. The $Ga_2O_3$ crystal grows more efficiently with a larger driving force for crystal growth.

FIG. 3 shows that the maximum temperature at which the driving force for growth is maintained is higher when using the GaCl gas as a Ga source gas than when using the $GaCl_3$ gas.

If hydrogen is contained in an atmosphere for growing the $\beta$-$Ga_2O_3$-based single crystal film 12, surface flatness and a driving force for growth of the $\beta$-$Ga_2O_3$-based single crystal film 12 decrease. Therefore, it is preferable that a $Cl_2$ gas not containing hydrogen be used as the Cl-containing gas.

Figure 4:
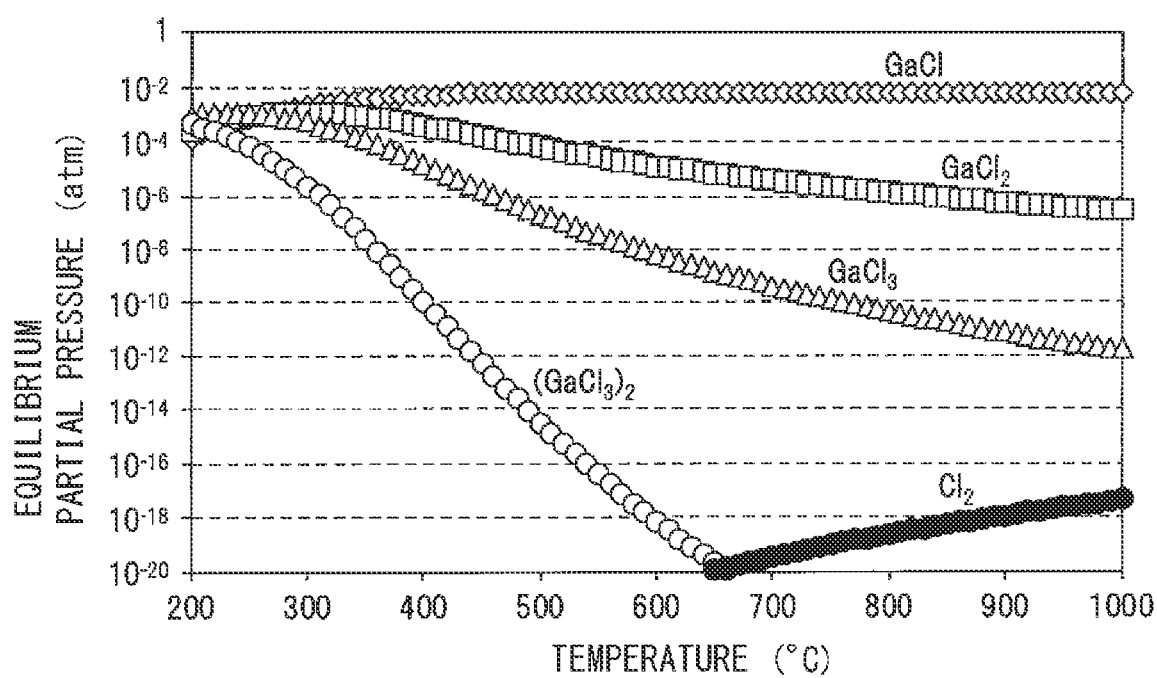
FIG. 4 is a graph showing a relation, based on calculation of thermal equilibrium, between an atmosphere temperature and equilibrium partial pressures of GaCl gas, $GaCl_2$ gas, $GaCl_3$ gas and $(GaCl_3)_2$ gas which are obtained by reaction of Ga with $Cl_2$.

FIG. 4 is a graph showing a relation, based on calculation of thermal equilibrium, between an atmosphere temperature during reaction and equilibrium partial pressures of GaCl gas, $GaCl_2$ gas, $GaCl_3$ gas and $(GaCl_3)_2$ gas which are obtained by reaction of Ga with $Cl_2$. The other calculation conditions are as follows: a carrier gas is, e.g., an inert gas such as $N_2$, a furnace pressure is 1 atm and the supplied partial pressure of $Cl_2$ gas is $3\times10^{-3}$ atm.

In FIG. 4, the horizontal axis indicates an atmosphere temperature (° C.) and the vertical axis indicates an equilibrium partial pressure (atm). It is shown that more gas is produced at a higher equilibrium partial pressure.

FIG. 4 shows that when reacting the metal gallium chloride with the Cl-containing gas at an atmosphere temperature of about not less than 300° C., the equilibrium partial pressure of GaCl gas particularly capable of increasing a driving force for growth of $Ga_2O_3$ crystal is increased, i.e., a partial pressure ratio of the GaCl gas with respect to the gallium chloride gas becomes higher. Based on this, it is preferable that the metal gallium in the reaction container 25 be reacted with the Cl-containing gas in a state that the atmosphere temperature in the source reaction region R1 is maintained at not less than 300° C. by using the first heating means 26.

Also, at the atmosphere temperature of, e.g., 850° C., the partial pressure ratio of the GaCl gas is predominantly high (the equilibrium partial pressure of the GaCl gas is four orders of magnitude greater than the $GaCl_2$ gas and is eight orders of magnitude greater than the $GaCl_3$ gas) and the gases other than GaCl gas hardly contribute to the growth of $Ga_2O_3$ crystal.

Meanwhile, in consideration of the lifetime of the first heating means 26 and heat resistance of the reaction chamber 20 formed of quartz glass, etc., it is preferable that the metal gallium in the reaction container 25 be reacted with the Cl-containing gas in a state that the atmosphere temperature in the source reaction region R1 is maintained at not more than 1000° C.

Next, in the crystal growth region R2, the gallium chloride gas produced in the source reaction region R1 is mixed with the oxygen-containing gas introduced through the second gas introducing port 22 and the $Ga_2O_3$-based substrate 10 is exposed to the mixed gas, thereby epitaxially growing the $\beta$-$Ga_2O_3$-based single crystal film 12 on the $Ga_2O_3$-based substrate 10. At this time, in a furnace housing the reaction chamber 20, pressure in the crystal growth region R2 is maintained at, e.g., 1 atm.

When forming the $\beta$-$Ga_2O_3$-based single crystal film 12 containing an additive element such as Si or Al, a source gas of the additive element (e.g., a chloride gas such as silicon tetrachloride ($SiCl_4$)) is introduced, together with the gallium chloride gas and the oxygen-containing gas, into the crystal growth region R2 through the gas introducing port 22.

If hydrogen is contained in an atmosphere for growing the $\beta$-$Ga_2O_3$-based single crystal film 12, surface flatness and a driving force for growth of the $\beta$-$Ga_2O_3$-based single crystal film 12 decrease. Therefore, it is preferable that an $O_2$ gas not containing hydrogen be used as the oxygen-containing gas.

Figure 5:
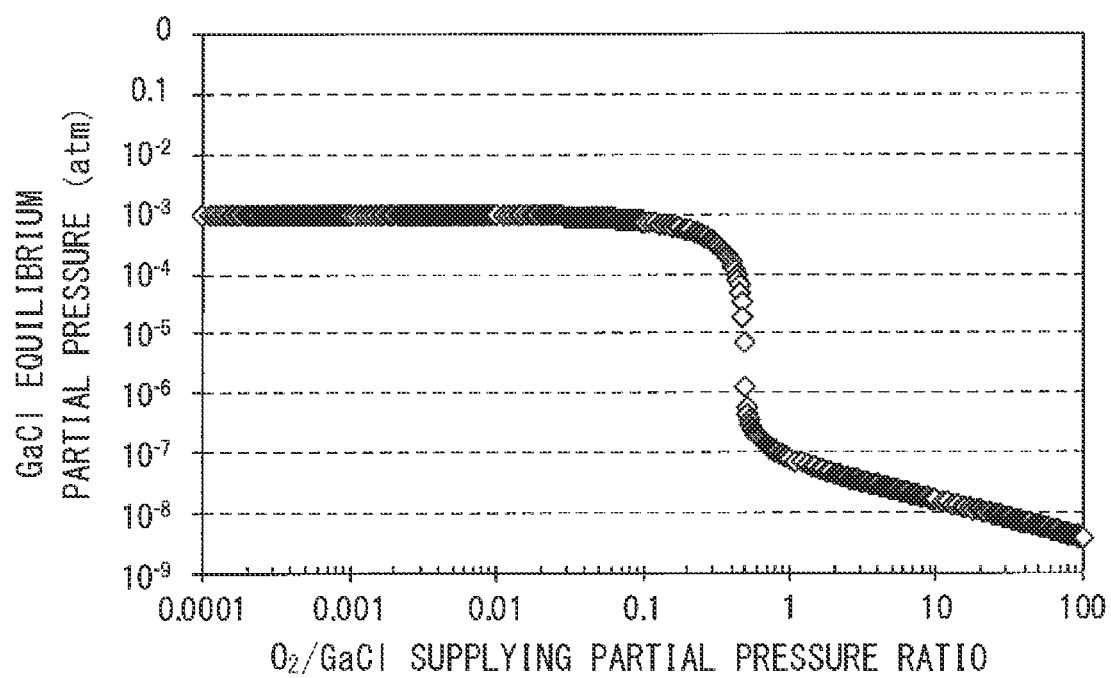
FIG. 5 is a graph showing a relation, based on calculation of thermal equilibrium, between equilibrium partial pressure of GaCl and an $O_2$/GaCl supplied partial pressure ratio when the atmosphere temperature during $Ga_2O_3$ crystal growth is 1000° C.

FIG. 5 is a graph showing a relation, based on calculation of thermal equilibrium, between an equilibrium partial pressure of GaCl and an $O_2$/GaCl supplied partial pressure ratio when the atmosphere temperature during $Ga_2O_3$ crystal growth is 1000° C. Here, a ratio of the supplied partial pressure of the $O_2$ gas to the supplied partial pressure of the GaCl gas is referred to as "$O_2$/GaCl supplied partial pressure ratio". It is calculated using the supplied partial pressure value of the GaCl gas fixed to $1 \times 10^{-3}$ atm, a furnace pressure of 1 atm adjusted by using, e.g., an inert gas such as $N_2$ as a carrier gas, and various values of the $O_2$ gas supplied partial pressure.

In FIG. 5, the horizontal axis indicates the $O_2$/GaCl supplied partial pressure ratio and the vertical axis indicates an equilibrium partial pressure (atm) of the GaCl gas. It is shown that the smaller the supplied partial pressure of the GaCl gas, the more the GaCl gas is consumed for growth of $Ga_2O_3$ crystal, i.e., the $Ga_2O_3$ crystal grows efficiently.

FIG. 5 shows that the equilibrium partial pressure of the GaCl gas sharply falls at the $O_2$/GaCl supplied partial pressure ratio of not less than 0.5.

Based on this, to efficiently grow the $\beta$-$Ga_2O_3$-based single crystal film 12, the $\beta$-$Ga_2O_3$-based single crystal film 12 is preferably grown in a state that a ratio of the supplied partial pressure of the $O_2$ gas to the supplied partial pressure of the GaCl gas in the crystal growth region R2 is not less than 0.5.

Figure 6:
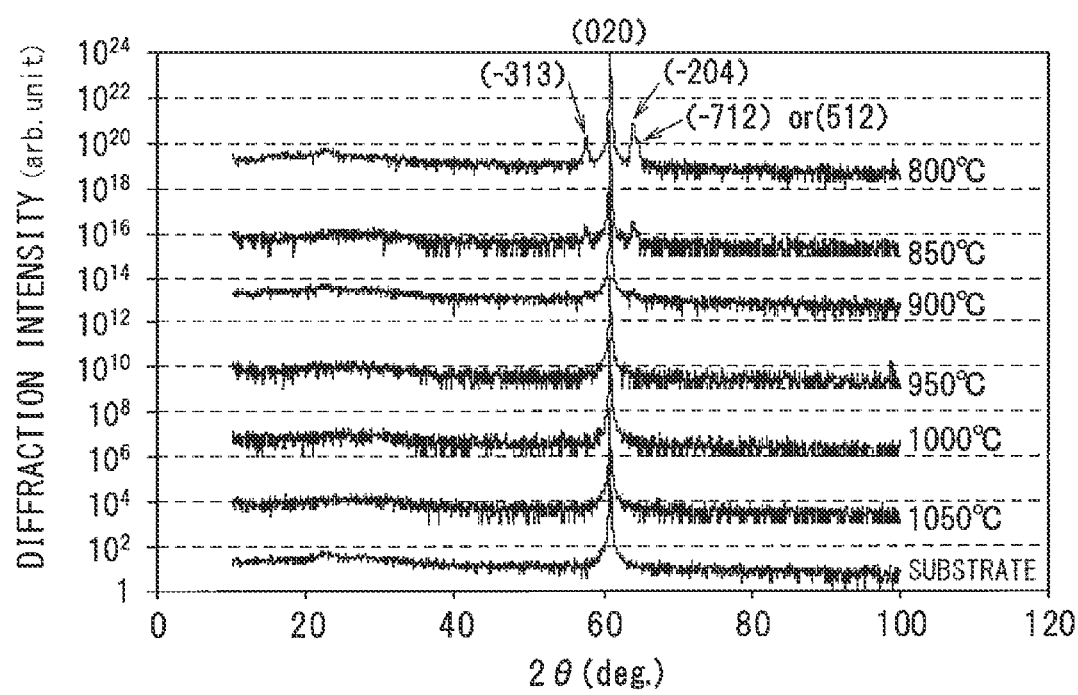
FIG. 6 is a graph showing X-ray diffraction spectra obtained by 2θ-ω scan on crystalline layered structure in each of which a $Ga_2O_3$ single crystal film is epitaxially grown on a (010)-oriented principal surface of a $Ga_2O_3$ substrate.

FIG. 6 is a graph showing X-ray diffraction spectra obtained by 2θ-ω scan on crystalline layered structures in each of which a $Ga_2O_3$ single crystal film is epitaxially grown on a (010)-oriented principal surface of a $\beta$-$Ga_2O_3$ substrate. The growth conditions are as follows: a furnace pressure is 1 atm, a carrier gas is $N_2$ gas, the GaCl supplied partial pressure is $5 \times 10^{-4}$ atm, and the $O_2$/GaCl supplied partial pressure ratio is 5.

In FIG. 6, the horizontal axis indicates an angle 2θ (degrees) formed between the incident direction and the reflected direction of X-ray and the vertical axis indicates diffraction intensity (arbitrary unit) of the X-ray.

FIG. 6 shows a spectrum from a $\beta$-$Ga_2O_3$ substrate (without $\beta$-$Ga_2O_3$ crystal film) and spectra from crystalline layered structures having $\beta$-$Ga_2O_3$ crystal films respectively epitaxially grown at 800° C., 850° C., 900° C., 950° C., 1000° C. and 1050° C. The $\beta$-$Ga_2O_3$ crystal films of these crystalline layered structures have a thickness of about 300 to 1000 nm.

Diffraction peaks from a (−313) plane, a (−204) plane and a (−712) plane or a (512) plane resulting from the presence of non-oriented grains, which are observed in the spectra from the crystalline layered structures having the $\beta$-$Ga_2O_3$ crystal films grown at growth temperatures of 800° C. and 850° C., disappear in the spectra from the crystalline layered structures having the $\beta$-$Ga_2O_3$ crystal films grown at growth temperatures of not less than 900° C. This shows that a $\beta$-$Ga_2O_3$ single crystal film is obtained when a $Ga_2O_3$ single crystal film is grown at a growth temperature of not less than 900° C.

Also in case that the principal surface of the $\beta$-$Ga_2O_3$ substrate has a plane orientation of (−201), (001) or (101), a $\beta$-$Ga_2O_3$ single crystal film is obtained when a $\beta$-$Ga_2O_3$ crystal film is grown at a growth temperature of not less than 900° C. In addition, also in case that another $Ga_2O_3$-based substrate is used in place of the $Ga_2O_3$ substrate or another $Ga_2O_3$-based crystal film is formed instead of the $Ga_2O_3$ crystal film, evaluation results similar to those described above are obtained. In other words, when the plane orientation of the principal surface of the $Ga_2O_3$-based substrate 10 is (010), (−201), (001) or (101), the $\beta$-$Ga_2O_3$-based single crystal film 12 is obtained by growing at a growth temperature of not less than 900° C.

Figure 7:
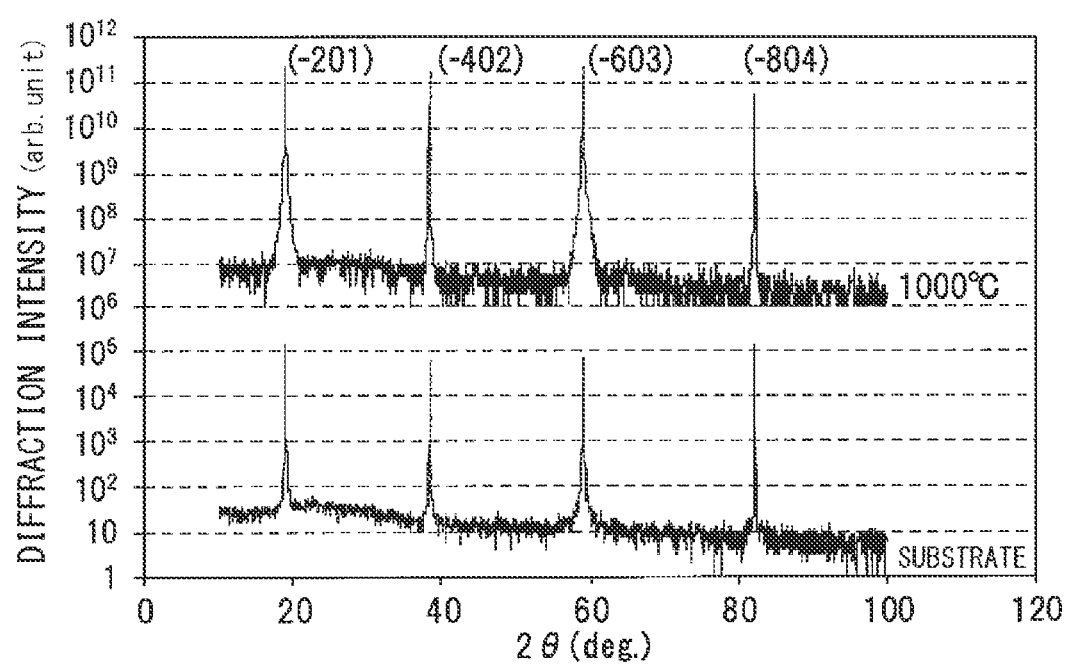
FIG. 7 is a graph showing an X-ray diffraction spectrum obtained by 2θ-ω scan on a crystalline layered structure in which a $Ga_2O_3$ single crystal film is epitaxially grown on a (−201)-oriented principal surface of a $Ga_2O_3$ substrate at 1000° C.

FIG. 7 is a graph showing an X-ray diffraction spectrum obtained by 2θ-ω scan on a crystalline layered structure in which a $\beta$-$Ga_2O_3$ single crystal film is epitaxially grown on a (−201)-oriented principal surface of a $\beta$-$Ga_2O_3$ substrate. The growth conditions for this $\beta$-$Ga_2O_3$ single crystal film are as follows: a furnace pressure is 1 atm, a carrier gas is $N_2$ gas, the GaCl supplied partial pressure is $5 \times 10^{-4}$ atm, the $O_2$/GaCl supplied partial pressure ratio is 5 and the growth temperature is 1000° C.

FIG. 7 shows a spectrum from a $\beta$-$Ga_2O_3$ substrate (without $\beta$-$Ga_2O_3$ crystal film) having a (−201)-oriented principal surface and a spectrum from a crystalline layered structure having a $\beta$-$Ga_2O_3$ crystal film epitaxially grown on the $\beta$-$Ga_2O_3$ substrate at 1000° C. The $\beta$-$Ga_2O_3$ crystal film of this crystalline layered structure has a thickness of about 300 nm.

Figure 8:
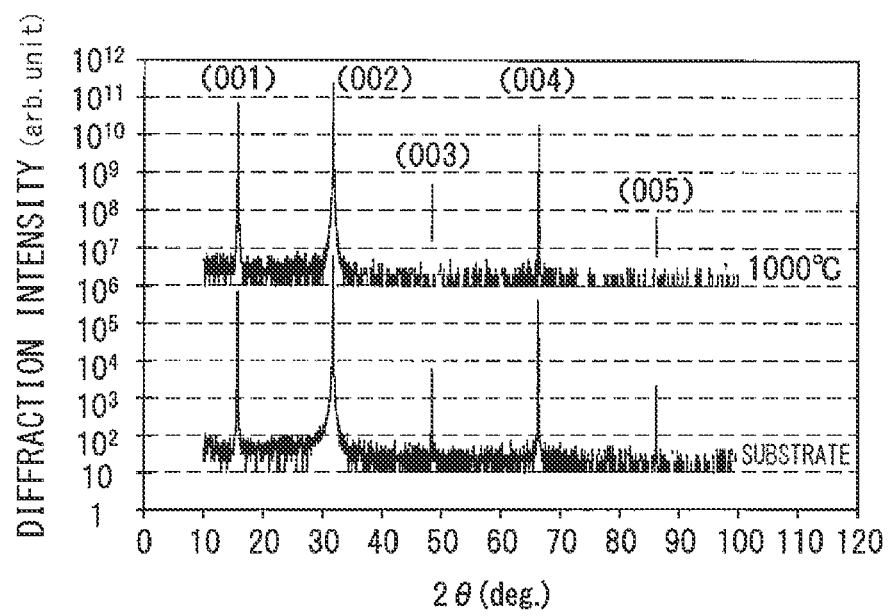
FIG. 8 is a graph showing an X-ray diffraction spectrum obtained by 2θ-ω scan on a crystalline layered structure in which a $Ga_2O_3$ single crystal film is epitaxially grown on a (001)-oriented principal surface of a $\beta$-$Ga_2O_3$ substrate.

FIG. 8 is a graph showing an X-ray diffraction spectrum obtained by 2θ-ω scan on a crystalline layered structure in which a $Ga_2O_3$ single crystal film is epitaxially grown on a (001)-oriented principal surface of a $\beta$-$Ga_2O_3$ substrate. The growth conditions for this $\beta$-$Ga_2O_3$ single crystal film are as follows: a furnace pressure is 1 atm, a carrier gas is $N_2$ gas, the GaCl supplied partial pressure is $5 \times 10^{-4}$ atm, the $O_2$/GaCl supplied partial pressure ratio is 5 and the growth temperature is 1000° C.

FIG. 8 shows a spectrum from a $\beta$-$Ga_2O_3$ substrate (without $\beta$-$Ga_2O_3$ crystal film) having a (001)-oriented principal surface and a spectrum from a crystalline layered structure having a $\beta$-$Ga_2O_3$ crystal film epitaxially grown on the $\beta$-$Ga_2O_3$ substrate at 1000° C. The $\beta$-$Ga_2O_3$ crystal film of this crystalline layered structure has a thickness of about 6 μm.

Figure 9:
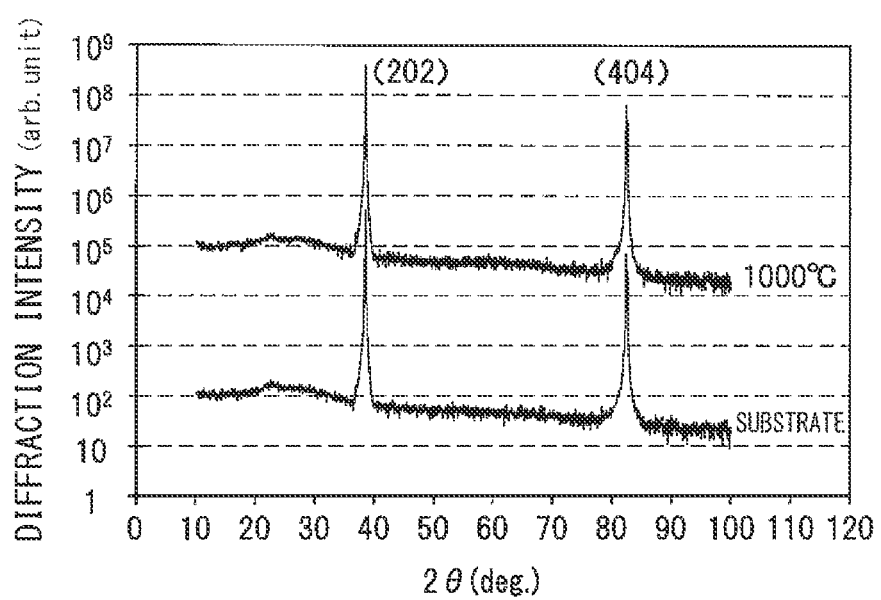
FIG. 9 is a graph showing an X-ray diffraction spectrum obtained by 2θ-ω scan on a crystalline layered structure in which a $Ga_2O_3$ single crystal film is epitaxially grown on a (101)-oriented principal surface of a $\beta$-$Ga_2O_3$ substrate.

FIG. 9 is a graph showing an X-ray diffraction spectrum obtained by 2η-ω scan on a crystalline layered structure in which a $Ga_2O_3$ single crystal film is epitaxially grown on a (101)-oriented principal surface of a $\beta$-$Ga_2O_3$ substrate. The growth conditions for this $\beta$-$Ga_2O_3$ single crystal film are as follows: a furnace pressure is 1 atm, a carrier gas is $N_2$ gas, the GaCl supplied partial pressure is $5 \times 10^{-4}$ atm, the $O_2$/GaCl supplied partial pressure ratio is 5 and the growth temperature is 1000° C.

FIG. 9 shows a spectrum from a $\beta$-$Ga_2O_3$ substrate (without $\beta$-$Ga_2O_3$ crystal film) having a (101)-oriented principal surface and a spectrum from a crystalline layered structure having a $\beta$-$Ga_2O_3$ crystal film epitaxially grown on the $\beta$-$Ga_2O_3$ substrate at 1000° C. The $\beta$-$Ga_2O_3$ crystal film of this crystalline layered structure has a thickness of about 4 μm.

In FIGS. 7, 8 and 9, the horizontal axis indicates an angle 2θ (degrees) formed between the incident direction and the reflected direction of X-ray and the vertical axis indicates diffraction intensity (arbitrary unit) of the X-ray.

In FIGS. 7, 8 and 9, diffraction peaks of the spectrum from the crystalline layered structure having the $\beta$-$Ga_2O_3$ crystal film grown at a growth temperature of 1000° C. are coincident with the diffraction peaks of the spectrum from the $\beta$-$Ga_2O_3$ substrate. This result shows that a $\beta$-$Ga_2O_3$ single crystal film is obtained when the $\beta$-$Ga_2O_3$ crystal film is grown on the principal surface of the $\beta$-$Ga_2O_3$ substrate having a plane orientation of (010), (−201), (001) or (101) at a growth temperature of 1000° C.

Figure 10A:
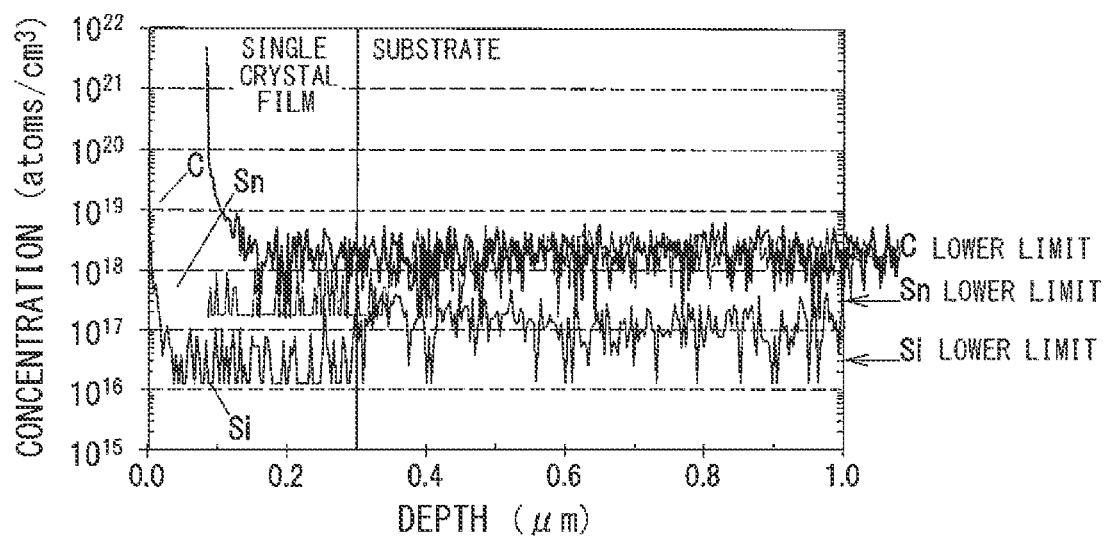
FIG. 10A is a graph showing the concentration of impurities in the crystalline layered structure measured by secondary ion mass spectrometry (SIMS).
Figure 10B:
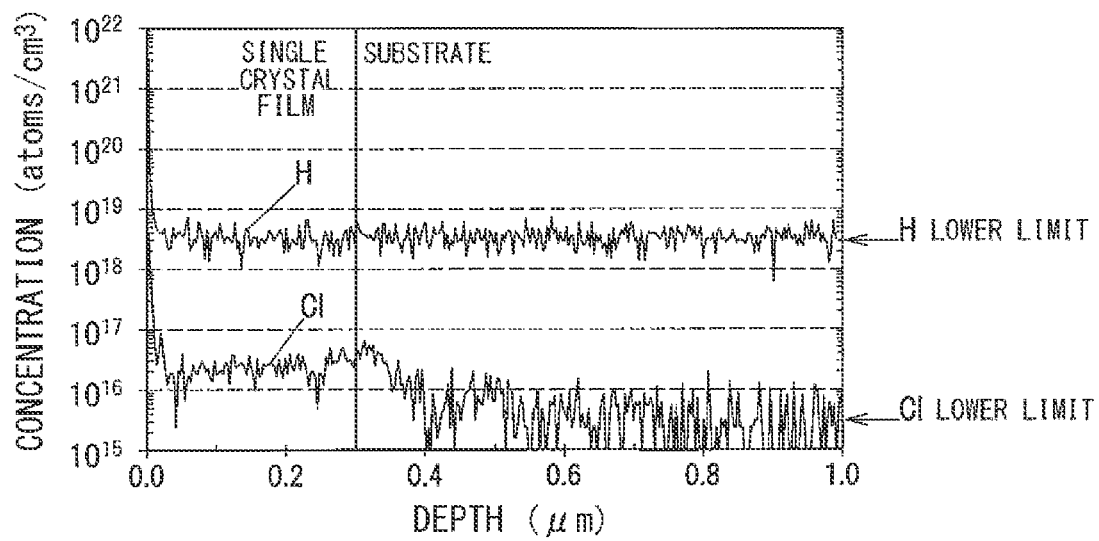
FIG. 10B is a graph showing the concentration of impurities in the crystalline layered structure measured by secondary ion mass spectrometry (SIMS).

FIGS. 10A and 10B are graphs showing concentrations of impurities in the crystalline layered structure measured by secondary ion mass spectrometry (SIMS).

In FIGS. 10A and 10B, the horizontal axis indicates a depth (μm) of the crystalline layered structure from a principal surface 13 of the $\beta$-$Ga_2O_3$ single crystal film and the vertical axis indicates concentration (atoms/cm$^3$) of each impurity. Here, an interface between the $\beta$-$Ga_2O_3$ substrate and the β-Ga$_2$O$_3$ single crystal film is located at a depth of about 0.3 µm in the crystalline layered structure. In addition, horizontal arrows on the right side in FIGS. 10A and 10B indicate the respective measurable lower limits of concentrations of the impurity elements.

The β-Ga$_2$O$_3$ single crystal film of the crystalline layered structure used for the measurement is a film which is grown on the (010)-oriented principal surface of the β-Ga$_2$O$_3$ substrate at a growth temperature of 1000° C.

FIG. 10A shows the concentrations of C, Sn, and Si in the crystalline layered structure and FIG. 10B shows the concentrations of H and Cl in the crystalline layered structure. According to FIGS. 10A and 10B, the concentration of each impurity element in the β-Ga$_2$O$_3$ single crystal film is close to the measurable lower limit and is almost unchanged from the concentration in the Ga$_2$O$_3$ substrate. This shows that the β-Ga$_2$O$_3$ single crystal film is a highly pure film.

Similar evaluation results are obtained also in case that the principal surface of the β-Ga$_2$O$_3$ substrate has a plane orientation of (−201), (101) or (001). In addition, also in case that another Ga$_2$O$_3$-based substrate is used in place of the β-Ga$_2$O$_3$ substrate or another Ga$_2$O$_3$-based single crystal film is formed instead of the β-Ga$_2$O$_3$ single crystal film, evaluation results similar to those described above are obtained.

According to FIG. 10B, not more than about $5 \times 10^{16}$ (atoms/cm$^3$) of Cl is contained in the β-Ga$_2$O$_3$ single crystal film. This results from that the Ga$_2$O$_3$ single crystal film is formed by the HVPE method using Cl-containing gas. Generally, Cl-containing gas is not used to form a Ga$_2$O$_3$ single crystal film when using a method other than the HYPE method, and the Ga$_2$O$_3$ single crystal film does not contain Cl, or at least does not contain $1 \times 10^{16}$ (atoms/cm$^3$) or more of Cl.

Figure 11A:
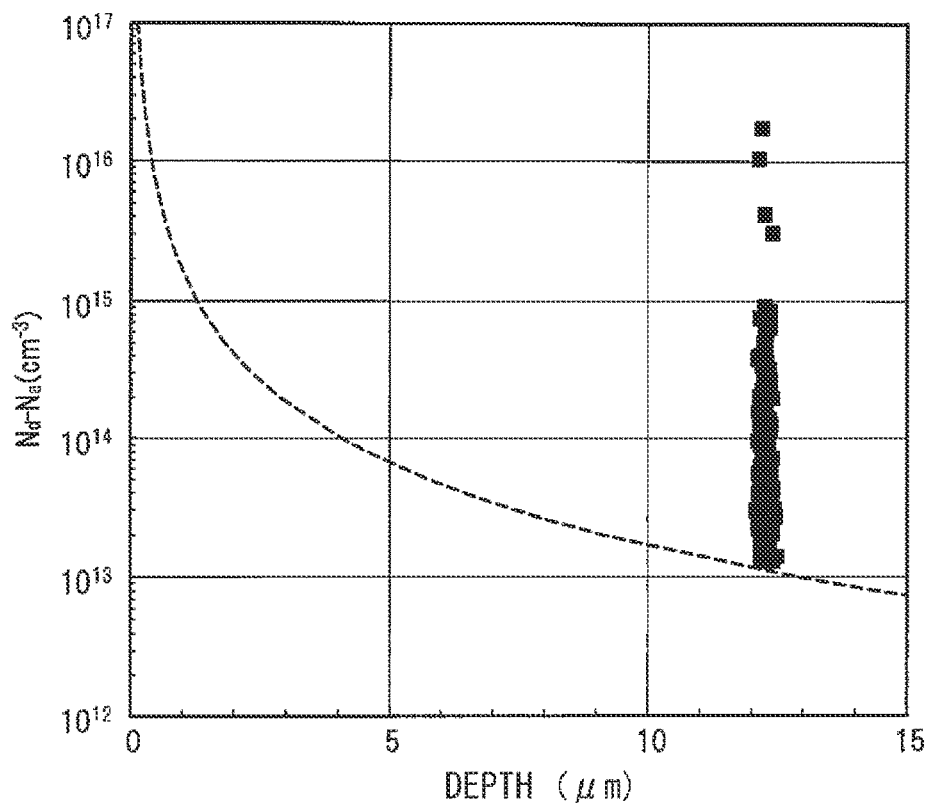
FIG. 11A is a graph showing the carrier concentration profile in a depth direction of the crystalline layered structure in which a $\beta$-$Ga_2O_3$ crystal film is epitaxially grown on a (001)-oriented principal surface of a $\beta$-$Ga_2O_3$ substrate.

FIG. 11A is a graph showing a carrier concentration profile in a depth direction of the crystalline layered structure in which a β-Ga$_2$O$_3$ crystal film is epitaxially grown on a (001)-oriented principal surface of a β-Ga$_2$O$_3$ substrate.

In FIG. 11A, the horizontal axis indicates a depth (µm) from the surface of the β-Ga$_2$O$_3$ crystal film and the vertical axis indicates a carrier concentration, i.e., a difference (cm$^{-3}$) between a donor concentration $N_d$ as a net donor concentration and an acceptor concentration $N_a$. Then, a dotted curved line in the drawing is a theoretical curve showing a relation between the donor concentration and depletion layer thickness when relative permittivity of β-Ga$_2$O$_3$ is 10 and built-in potential of β-Ga$_2$O$_3$ in contact with Pt is 1.5V.

The procedure used to obtain the data shown in FIG. 11A is as follows. Firstly, an undoped β-Ga$_2$O$_3$ crystal film having a thickness of about 15 µm is epitaxially grown on an Sn-doped n-type β-Ga$_2$O$_3$ substrate having a (001)-oriented principal surface by the HYPE method. "Undoped" here means that intentional doping is not carried out, and it does not deny the presence of unintentional impurities.

The β-Ga$_2$O$_3$ substrate is a 10 mm-square substrate having a thickness of 600 µm and has a carrier concentration of about $6 \times 10^{18}$ cm$^{-3}$. The growth conditions for this β-Ga$_2$O$_3$ crystal film are as follows: a furnace pressure is 1 atm, a carrier gas is N$_2$ gas, the GaCl supplied partial pressure is $5 \times 10^{-4}$ atm, the O$_2$/GaCl supplied partial pressure ratio is 5 and the growth temperature is 1000° C.

Next, the surface of the undoped β-Ga$_2$O$_3$ crystal film is polished 3 µm by CMP to flatten the surface.

Next, a Schottky electrode is formed on the β-Ga$_2$O$_3$ crystal film and an ohmic electrode on the β-Ga$_2$O$_3$ substrate, and C-V measurement is conducted while changing bias voltage in a range of +0 to −10V. Then, a carrier concentration profile in a depth direction is calculated based on the C-V measurement result.

The Schottky electrode here is an 800 µm-diameter circular electrode having a laminated structure in which a 15 nm-thick Pt film, a 5 nm-thick Ti film and a 250 nm-thick Au film are laminated in this order. Also, the ohmic electrode is a 10 mm-square electrode having a laminated structure in which a 50 nm-thick Ti film and a 300 nm-thick Au film are laminated in this order.

In FIG. 11A, no measurement point is present in a region shallower than 12 µm which is equal to the thickness of the β-Ga$_2$O$_3$ crystal film, and all measurement points are 12 µm on the horizontal axis. This shows that the entire region of the β-Ga$_2$O$_3$ crystal film is depleted in the bias voltage range of +0 to −10V.

Therefore, the entire region of the β-Ga$_2$O$_3$ crystal film is naturally depleted at the bias voltage of 0. It is predicted that the residual carrier concentration in the β-Ga$_2$O$_3$ crystal film is as very small as not more than $1 \times 10^{13}$ cm$^{-3}$ since the donor concentration is about $1 \times 10^{13}$ cm$^{-3}$ when the depletion layer thickness is 12 µm, based on the theoretical curve.

Since the residual carrier concentration in the β-Ga$_2$O$_3$ crystal film is not more than $1 \times 10^{13}$ cm$^{-3}$, for example, it is possible to control the carrier concentration in the β-Ga$_2$O$_3$ crystal film in a range of $1 \times 10^{13}$ to $1 \times 10^{20}$ cm$^{-3}$ by doping a IV group element.

Figure 11B:
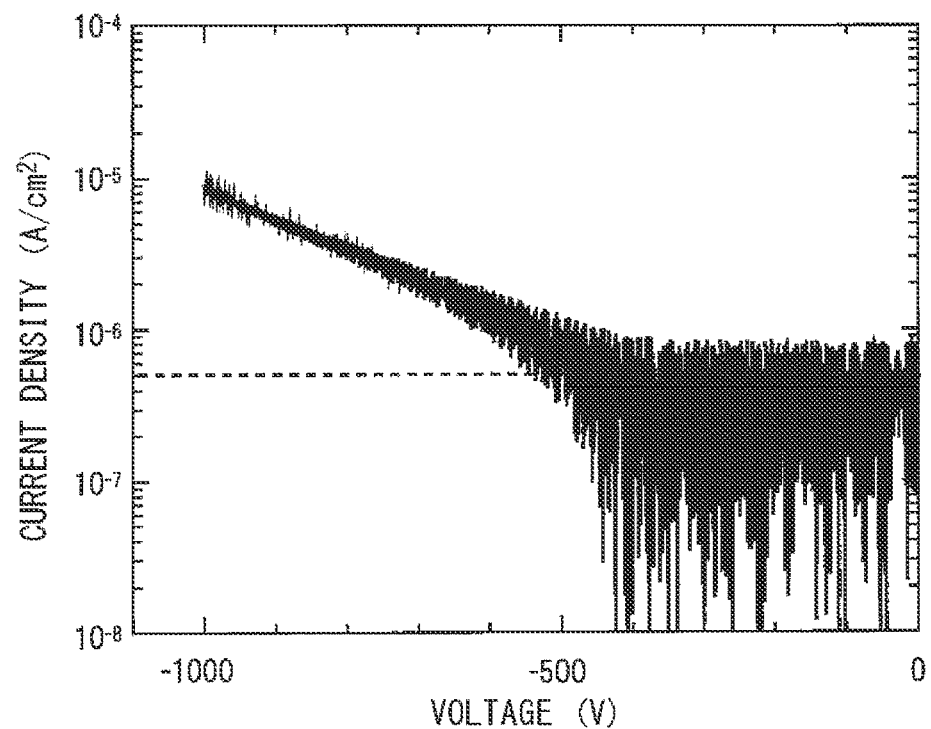
FIG. 11B is a graph showing the voltage endurance characteristics of the crystalline layered structure in which a $\beta$-$Ga_2O_3$ crystal film is epitaxially grown on a (001)-oriented principal surface of a $\beta$-$Ga_2O_3$ substrate.

FIG. 11B is a graph showing voltage endurance characteristics of the above-mentioned crystalline layered structure.

In FIG. 11B, the horizontal axis indicates applied voltage (V) and the vertical axis indicates current density (A/cm$^2$). In addition, a dotted straight line in the drawing indicates the measurable lower limit value.

The procedure used to obtain the data shown in FIG. 11B is as follows. Firstly, the above-mentioned crystalline layered structure composed of a β-Ga$_2$O$_3$ substrate and a β-Ga$_2$O$_3$ crystal film is prepared.

Next, a Schottky electrode is formed on the β-Ga$_2$O$_3$ crystal film and an ohmic electrode on the β-Ga$_2$O$_3$ substrate, and current density at an applied voltage of 1000V is measured.

The Schottky electrode here is a 200 µm-diameter circular electrode having a laminated structure in which a 15 nm-thick Pt film, a 5 nm-thick Ti film and a 250 nm-thick Au film are laminated in this order. Also, the ohmic electrode is a 10 mm-square electrode having a laminated structure in which a 50 nm-thick Ti film and a 300 nm-thick Au film are laminated in this order.

FIG. 11B shows that, even when voltage of 1000V is applied to the crystalline layered structure, leakage current is as very small as about $1 \times 10^{-5}$ A/cm$^2$ and insulation breakdown does not occur. This result is considered to be due to that the β-Ga$_2$O$_3$ crystal film is a high-quality crystal film with only few crystal defects and the donor concentration is low.

Figure 12:
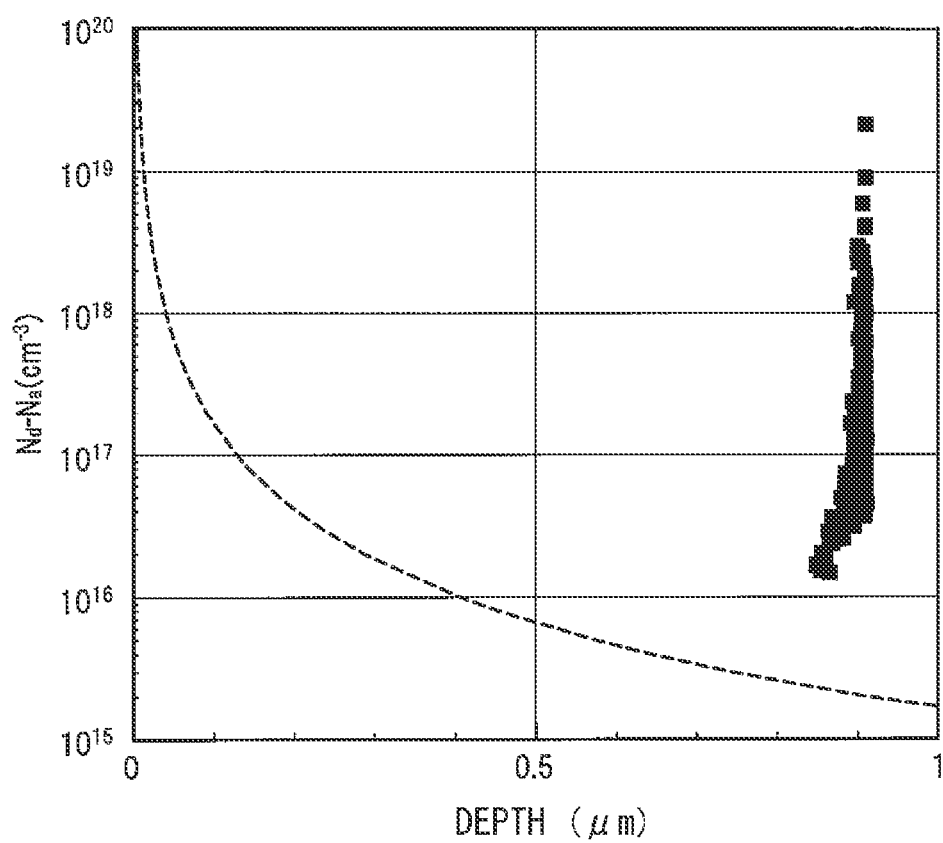
FIG. 12 is a graph showing a carrier concentration profile in a depth direction of the crystalline layered structure in which a $\beta$-$Ga_2O_3$ crystal film is epitaxially grown on a (010)-oriented principal surface of a $\beta$-$Ga_2O_3$ substrate.

FIG. 12 is a graph showing a carrier concentration profile in a depth direction of the crystalline layered structure in which a β-Ga$_2$O$_3$ crystal film is epitaxially grown on a (010)-oriented principal surface of a β-Ga$_2$O$_3$ substrate.

In FIG. 12, the horizontal axis indicates a depth (µm) from the surface of the β-Ga$_2$O$_3$ crystal film and the vertical axis indicates a carrier concentration, i.e., a difference (cm$^{-3}$) between a donor concentration $N_d$ as a net donor concentration and an acceptor concentration $N_a$. Then, a dotted curved line in the drawing is a theoretical curve showing a relation between the donor concentration and depletion layer thickness when relative permittivity of β-Ga$_2$O$_3$ is 10 and built-in potential of β-Ga$_2$O$_3$ in contact with Pt is 1.5V.

The procedure used to obtain the data shown in FIG. 12 is as follows. Firstly, an undoped β-Ga$_2$O$_3$ crystal film having a thickness of about 0.9 μm is epitaxially grown on an Sn-doped n-type β-Ga$_2$O$_3$ substrate having a (010)-oriented principal surface by the HYPE method.

The β-Ga$_2$O$_3$ substrate is a 10 mm-square substrate having a thickness of 600 μm and has a carrier concentration of about 6×10$^{18}$ cm$^{-3}$. The growth conditions for this β-Ga$_2$O$_3$ single crystal film are as follows: a furnace pressure is 1 atm, a carrier gas is N$_2$ gas, the GaCl supplied partial pressure is 5×10$^{-4}$ atm, the O$_2$/GaCl supplied partial pressure ratio is 5 and the growth temperature is 1000° C.

Next, a Schottky electrode is formed on the undoped β-Ga$_2$O$_3$ crystal film and an ohmic electrode on the β-Ga$_2$O$_3$ substrate, and C-V measurement is conducted while changing bias voltage in a range of +0 to −10V. Then, a carrier concentration profile in a depth direction is calculated based on the C-V measurement result.

The Schottky electrode here is a 400 μm-diameter circular electrode having a laminated structure in which a 15 nm-thick Pt film, a 5 nm-thick Ti film and a 250 nm-thick Au film are laminated in this order. Also, the ohmic electrode is a 10 mm-square electrode having a laminated structure in which a 50 nm-thick Ti film and a 300 nm-thick Au film are laminated in this order.

In FIG. 12, measurement points at a bias voltage of 0 are 0.85 μm on the horizontal axis (measurement points in a region deeper than 0.85 μm are measurement points when the bias voltage is close to 10V). It is predicted that the residual carrier concentration in the β-Ga$_2$O$_3$ crystal film is as very small as not more than 3×10$^{15}$ cm$^{-3}$ since the donor concentration is about 2.3×10$^{15}$ cm$^{-3}$ when the depletion layer thickness is 0.85 μm, based on the theoretical curve.

Effects of the Embodiment

According to the embodiment, by controlling the conditions of producing the gallium source gas and the growth conditions for the β-Ga$_2$O$_3$-based single crystal film in the HVPE method, it is possible to efficiently grow a high-quality and large-diameter β-Ga$_2$O$_3$-based single crystal film. In addition, since the β-Ga$_2$O$_3$-based single crystal film has excellent crystal quality, it is possible to grow a good-quality crystal film on the β-Ga$_2$O$_3$-based single crystal film. Thus, a high-quality semiconductor device can be manufactured by using the crystalline layered structure including the β-Ga$_2$O$_3$-based single crystal film in the present embodiment.

Although the embodiment of the invention has been described, the invention is not intended to be limited to the embodiment, and the various kinds of modifications can be implemented without departing from the gist of the invention.

In addition, the invention according to claims is not to be limited to the embodiment described above. Further, it should be noted that all combinations of the features described in the embodiment are not necessary to solve the problem of the invention.

Industrial Applicability

Provided are a method for efficiently growing a high-quality, large diameter β-Ga$_2$O$_3$-based single crystal film, and a crystalline layered structure having a β-Ga$_2$O$_3$-based single crystal film grown using this growing method.

REFERENCE SIGNS LIST

1: CRYSTALLINE LAYERED STRUCTURE
10: Ga$_2$O$_3$-BASED SUBSTRATE
11: PRINCIPAL SURFACE
12: β-Ga$_2$O$_3$-BASED SINGLE CRYSTAL FILM

The invention claimed is:

1. A method for growing a β-Ga$_2$O$_3$-based single crystal film on a Ga$_2$O$_3$-based substrate comprising the steps of:
producing a gallium chloride-based gas by reacting a metal gallium source with a Cl-including gas consisting of Cl$_2$ in a reaction region R1 of a reaction chamber, the gallium chloride-based gas includes a GaCl gas containing the highest partial pressure among component gases of the gallium chloride-based gas produced by the reaction in the reaction region R1, the highest partial pressure being between 10$^{-2}$ and 10$^{-3}$ atm,
mixing the gallium chloride-based gas with an oxygen-including gas consisting of O$_2$ not containing hydrogen in a crystal growth region R2 next to the reaction region R1,
exposing the Ga$_2$O$_3$-based substrate to a mixed gas comprising the gallium chloride-based gas and the oxygen-including gas in the crystal growth region R2; and
growing a β-Ga$_2$O$_3$-based single crystal film epitaxially on a principal surface of the Ga$_2$O$_3$-based substrate at a growth temperature of 900° C. to 1050° C.,
wherein the gallium chloride-based gas and the oxygen-including gas are carried in the crystal growth region R2 by an inert gas selected from the group consisting of N$_2$, Ar, and He,
wherein the β-Ga$_2$O$_3$-based single crystal film is epitaxially grown on the principal surface of the Ga$_2$O$_3$-based substrate in a state that a ratio of a supplied partial pressure of the O$_2$ gas to a supplied partial pressure of the gallium chloride-based gas in the crystal growth region R2 is not less than 5 and not more than 10,
wherein the residual carrier concentration, which is a difference between a donor concentration Nd and an acceptor concentration Na, in the β-Ga$_2$O$_3$-based single crystal film is not more than 1=10$^{13}$ atoms/cm$^3$, and
wherein the principal surface of the Ga$_2$O$_3$-based substrate has a plane orientation of (001).

2. The method for growing a β-Ga$_2$O$_3$-based single crystal film according to claim 1, wherein the gallium chloride-based gas is produced at an atmosphere temperature of not less than 300° C.

3. The method for growing a β-Ga$_2$O$_3$-based single crystal film according to claim 1, wherein the gallium chloride-based gas and the oxygen-including gas are carried by the N$_2$ gas.

4. A crystalline layered structure formed according to the method of claim 1.

5. The crystalline layered structure according to claim 4, wherein the β-Ga$_2$O$_3$-based single crystal film is a β-Ga$_2$O$_3$ single crystal film.

* * * * *